United States Patent [19]

Shah

[11] Patent Number: 4,586,166

[45] Date of Patent: Apr. 29, 1986

[54] SRAM WITH IMPROVED SENSING CIRCUIT

[75] Inventor: Ashwin H. Shah, Dallas, Tex.

[73] Assignee: Texas Instruments Incorporated, Dallas, Tex.

[21] Appl. No.: 528,368

[22] Filed: Aug. 31, 1983

[51] Int. Cl.[4] .............................................. G11C 11/40
[52] U.S. Cl. .................................... 365/154; 365/190; 365/207; 307/530
[58] Field of Search ................ 365/154, 156, 190, 207; 307/530

[56] References Cited

U.S. PATENT DOCUMENTS 4,498,154  2/1985  Hoffmann ........................... 365/207

Primary Examiner—Terrell W. Fears

Attorney, Agent, or Firm—Robert Groover, III; Douglas A. Sorensen; Melvin Sharp

[57] ABSTRACT

A static random access memory wherein positive feedback is used in the bit line loads. The output of the first sense amplifier stage is fedback to the gates of depletion-made bit line load transistors, to provide positive feedback during the read or write operation. That is, since one of the complementary bit lines which the accessed memory cell is attempting to pull down sees a load impedance which gradually becomes higher and higher, the memory cell can pull down this bit line more rapidly. To accomplish this with stability, the first sense amplifier stage has less than unity open loop gain, and a succeeding sense amplifier stage is therefore used for further amplification.

14 Claims, 14 Drawing Figures

FEEDBACK SENSE AMPLIFIER

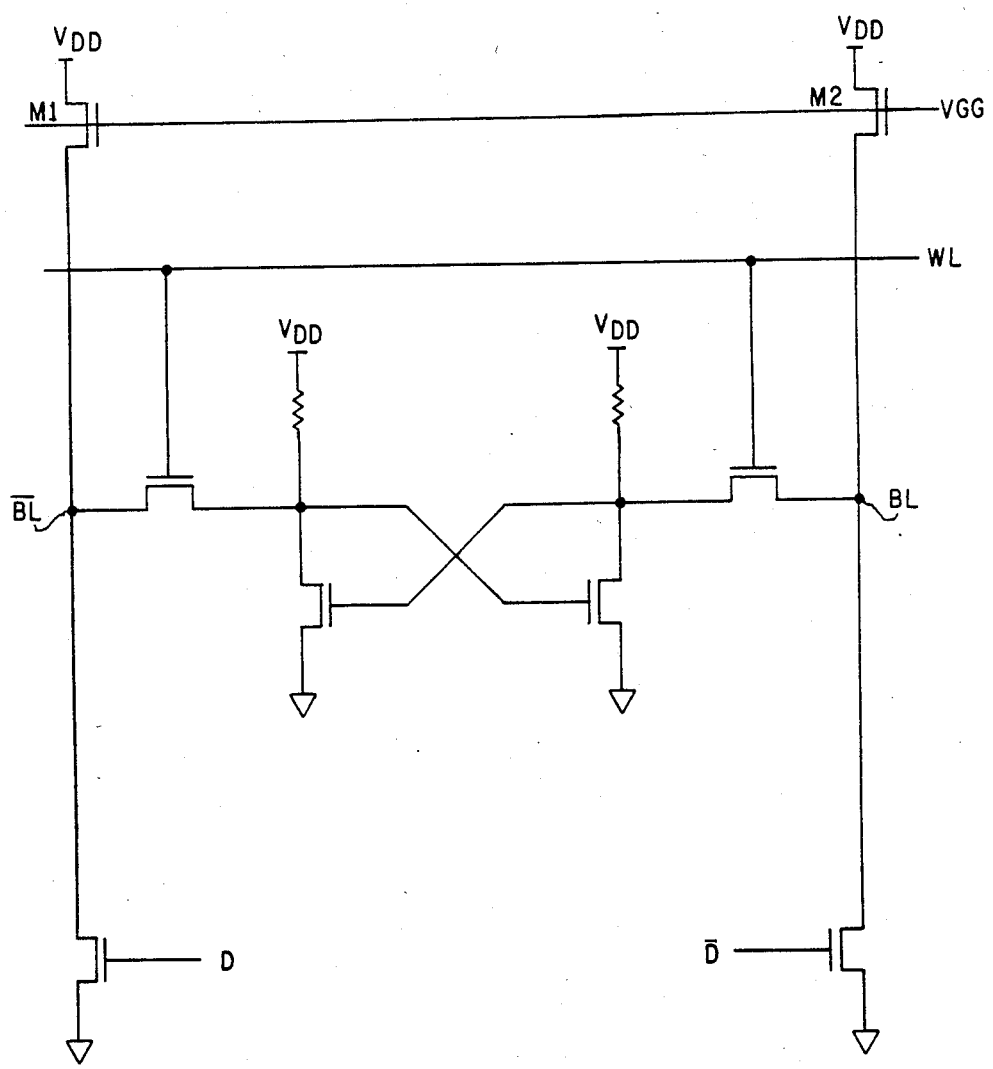
*Fig. 1a* ENHANCEMENT BIT-LINE LOAD DEVICES

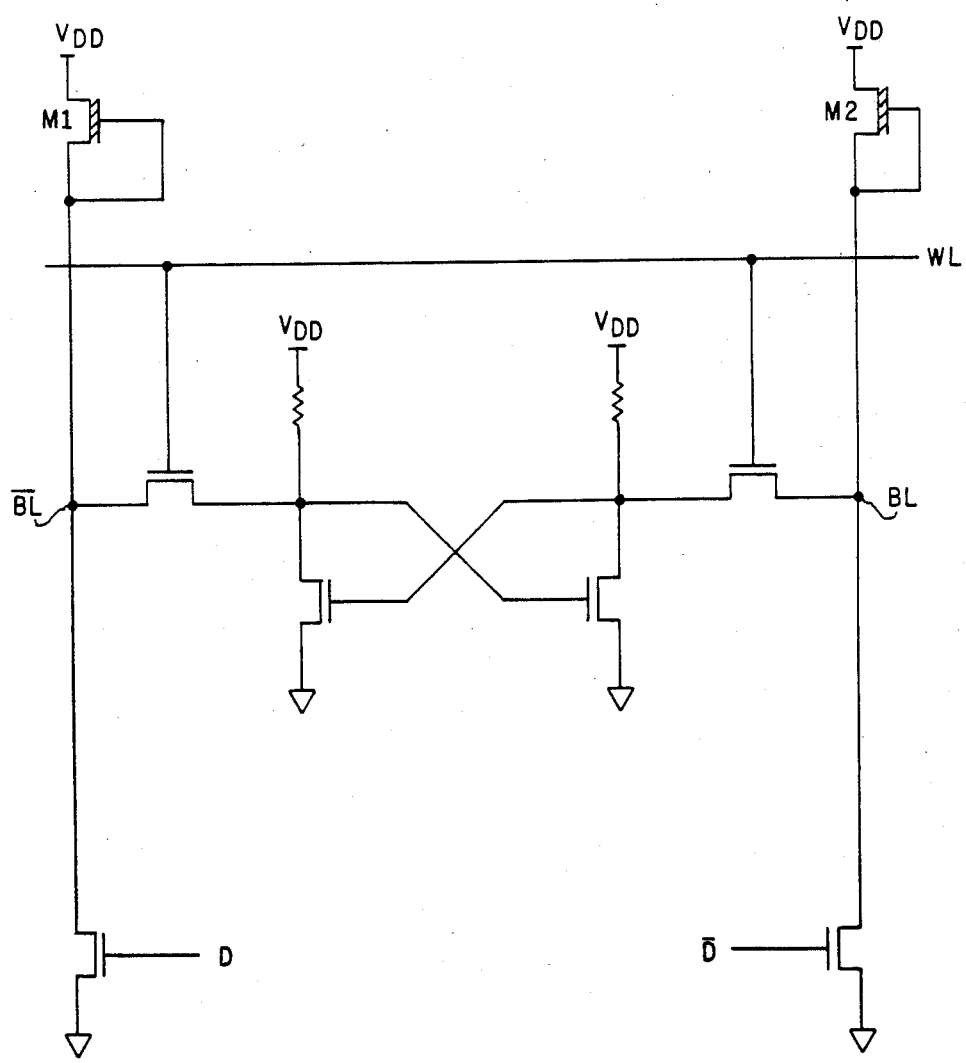
*Fig.1b* DEPLETION BIT-LINE LOAD DEVICES

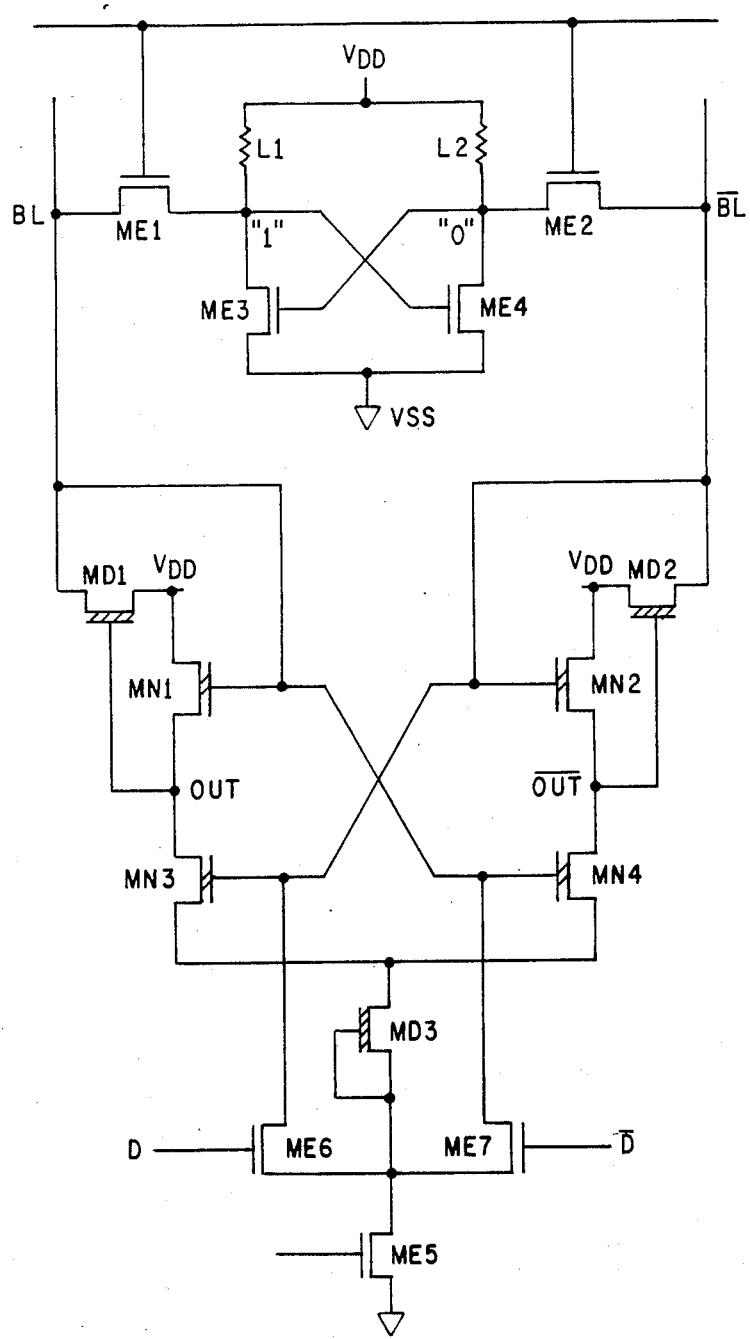
Fig.2 FEEDBACK SENSE AMPLIFIER

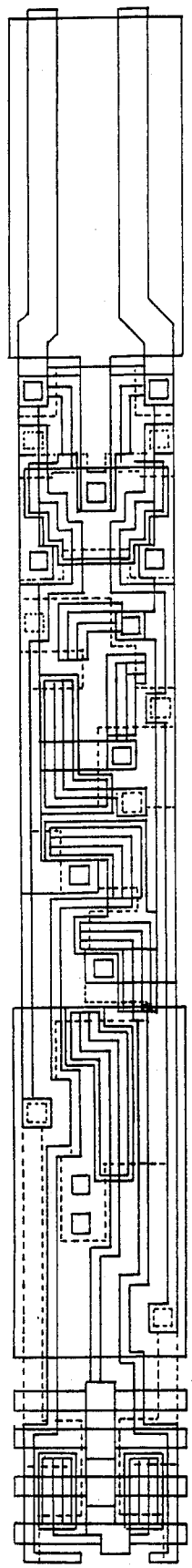
Fig.3a ALL LEVELS
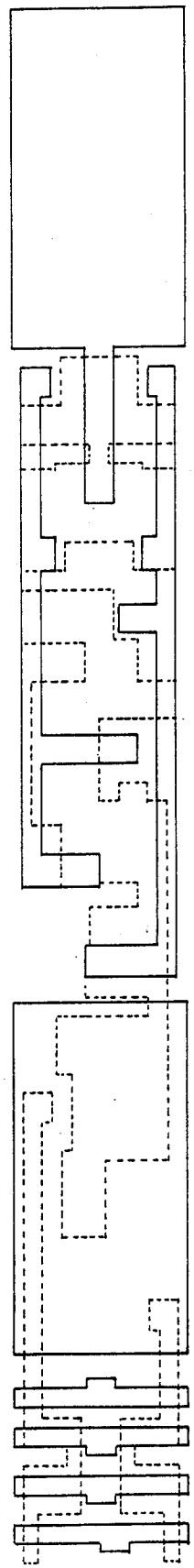
Fig.3b MOAT + METAL
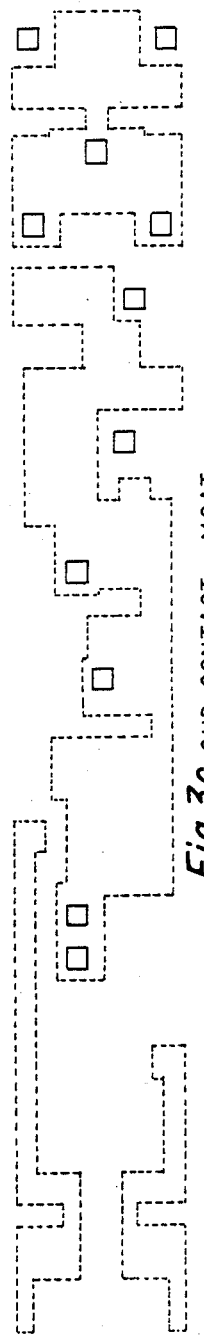
Fig.3c 2ND CONTACT + MOAT
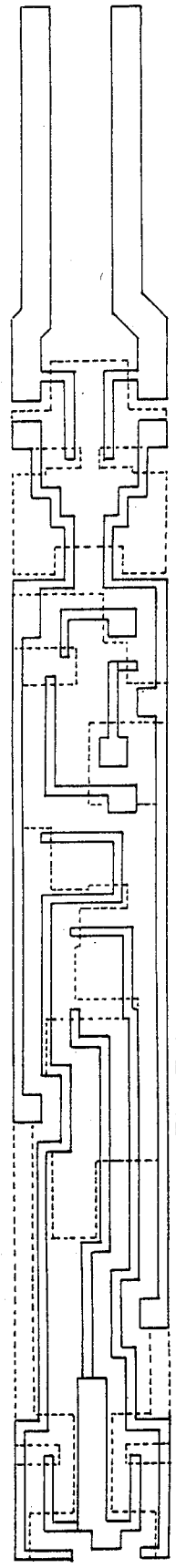
Fig.3d POLY + MOAT

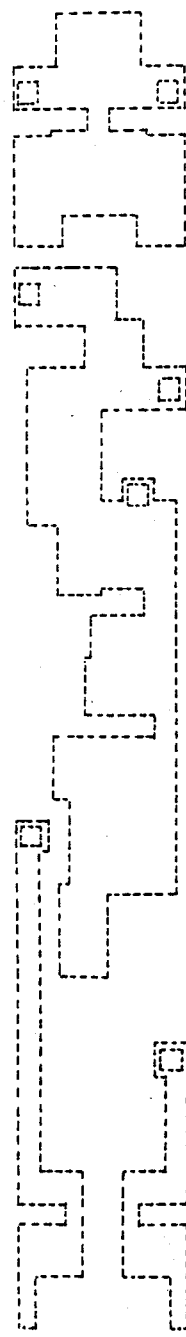
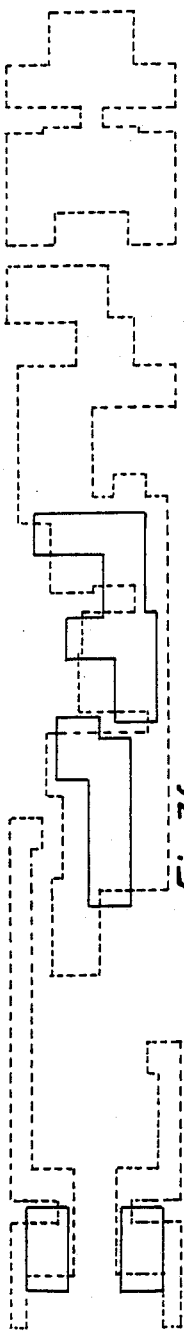
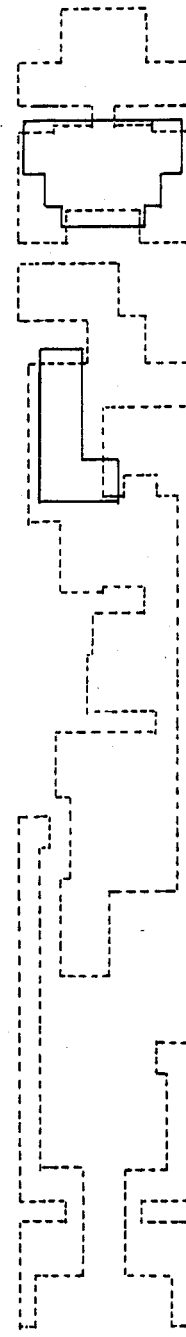
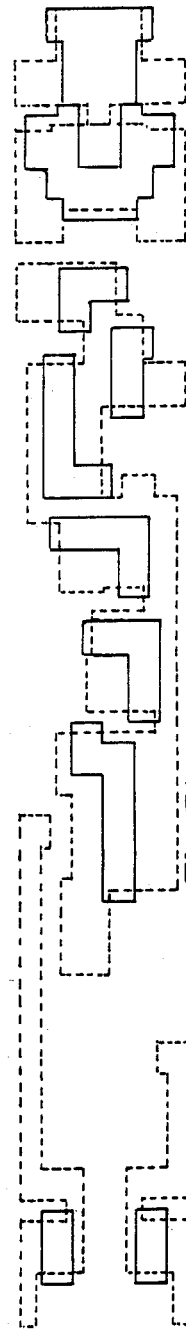
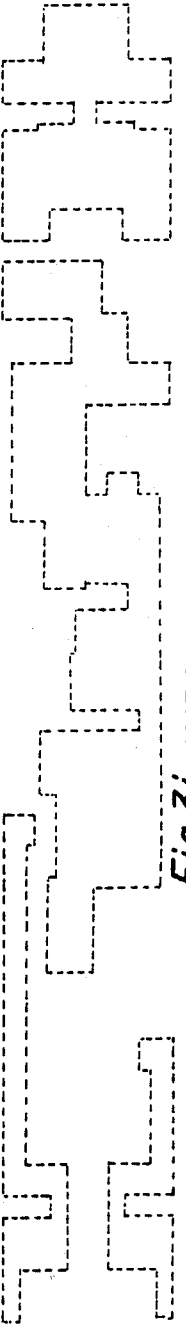
Fig.3e  1ST CONTACT+MOAT
Fig.3f  ENHANCEMENT+MOAT
Fig.3g  DEPLETION+MOAT
Fig.3h  NVNX+MOAT
Fig.3i  MOAT ONLY

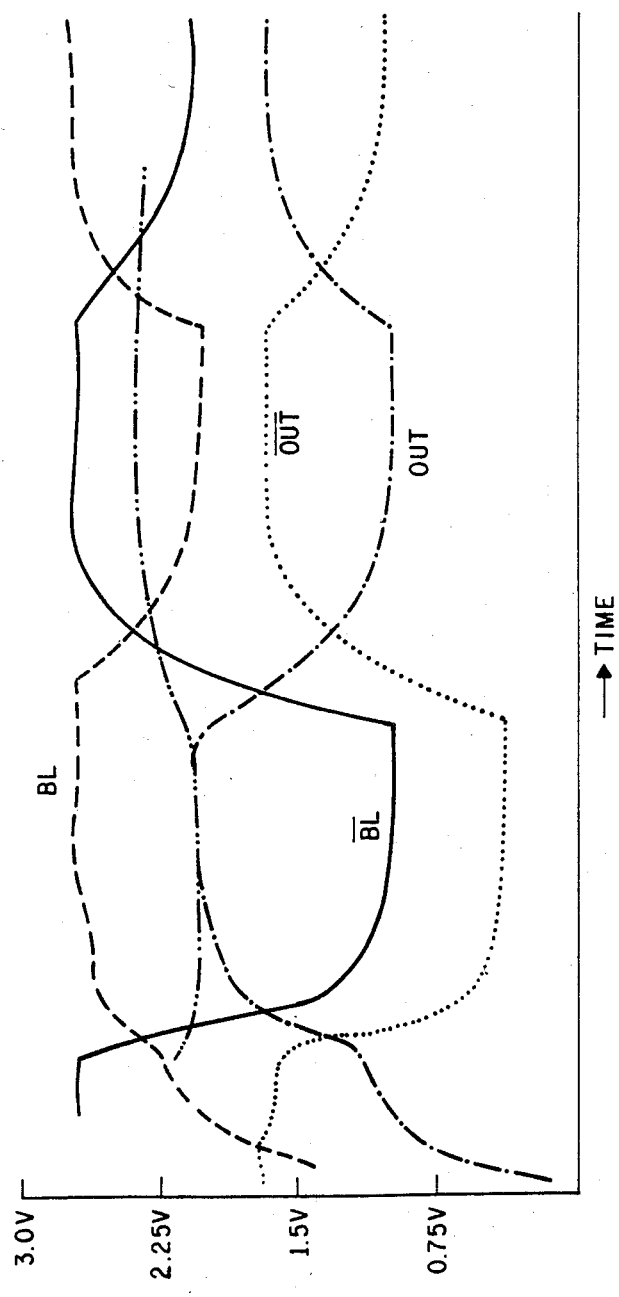
Fig.5  TIMING DIAGRAM

SRAM WITH IMPROVED SENSING CIRCUIT

BACKGROUND AND SUMMARY OF THE INVENTION

The present invention relates to semiconductor memories, and particulary to static random access memories (SRAMs).

The sensing technique used in almost all the state-of-the-art static RAMs is analog amplification of the differential signal on the bit-lines. The storage cell when accessed through two pass devices puts a differential voltage on the bit-lines. FIG. 1 shows two of the conventional load device schemes. It is desirable to have bit lines precharged to a certain voltage level and then sense the differential signal available on the bit lines during read mode. Furthermore, the differential signal on the bit lines is designed to be as small as possible without degrading the read performance, in order not to disturb unselected memory locations during the read operation. As the signal gets smaller, the sensing/amplification becomes more difficult as well as slower, but, the bit-lines recover much faster from the differential voltage which they may have received during the previous cycle.

As FIG. 1A shows, a conventional state-of-the-art fully static RAM uses load devices to keep the bit-lines pre-charged as well as to maintain an optimum signal swing on the bit-lines during Read mode. Writing into an accessed cell is performed by phoms on the bit-lines a very large signal (from the data input drivers). Thus it is also important to keep the signal swing during read mode much smaller than the signal during Write mode, in order to avoid any alterations of data during read mode. The load devices M1 and M2 as shown in FIG. 1A have a constant voltage VGG on their gate terminals. The gate bias voltage is chosen in accordance with the storage cell characteristics and other AC and DC design parameters, such as sense amplifier gain etc. The bit-lines are usually precharged to a high voltage level. This volltage level depends on the gate bias of the load voltage devices for the bit-lines.

An alternate scheme (FIG. 1B) is to use a depletion type devices in the load configuration, i.e., to tie the gate terminal of the depletion device to the bit-line which is also the source terminal of the depletion device. In either configuration, during Read mode, the load current either increases or at best remains constant as the bit-line voltage is lowered from the precharged level. The cell being accessed has to overcome the constant current or increasing current in order to provide sufficiently large signal on the bit-lines. The load current from depletion load devices may not remain constant either and actually may increase depending upon the backgate biaseffects. Thus, the conventional state-of-the-art sense amplifiers have a built-in conflict between the storage cell devices and the bit-line load devices. This conflict results in lower driver speed and higher power dissipation.

This conflict has even worse effects on power dissipation during the Write mode since a larger signal is being forced onto the bit-lines. During read operation the cross-coupled devices of the static memory cell become the driver devices for the bit-lines, while the series combination of the bit-line load devices and the cell pass devices act as the load device for the cell inverter. If the gate of the bit line load devices are at a constant voltage, the current through them will increase as the cell driver device tries to pull the corresponding bit-line low during read mode. During write operation the bit-line pull-up devices alone act as load devices while the data-write devices (M3,M4) act as drive devices. This configuration needs very high gain in order to generate a large differential voltage on the bit lines required during a write operation.

The present invention improves the pre-sense amplifier by using positive feedback from the sense amplifier to the bit-line pull-up (load) devices. The bit-lines each have a depletion-mode transistor as a load device, as in conventional sense amplifiers, but the gate of each of the load device is NOT connected to the corresponding bit-lines which are the source terminals of these depletion load devices. The gate terminals of the load devices are instead connected to the outputs of the pre-sense amplifier. The inputs to the pre-sense amplifier are the bit-lines, as in the conventional circuits. The pre-sense amplifier is a simple differential source-follower amplifier with nearly unity gain. The bit-lines are precharged to VDD by current through the depletion load devices. The pre-sense amplifier provides a voltage shift to the bit-line differential voltage. The bit-lines have a dc offset of approximately VDD. The output differential signal of the pre-sense amplifier stage is offset by about ($\frac{1}{2}$) VDD. Also, the depletion device Vt is approximately ($\frac{1}{2}$) VDD. These voltage conditions imply a near cut-off (and therefore high-gain) operation of the depletion feed-back load devices. The pre-sense-amplifier stage is powered up by a column select line which provides a current path to ground via the depletion constant current source. When a cell is being read, the initial bit-lines differential voltage gets a downward voltage shift from the pre-sense amplifier. This differential voltage appears on the gates of the load devices, whose transconductance is therefore modified such that the bit-line going low sees a higher impedance depletion load (feed-back) device, whereas the other bit line sees a lower impedance. This positive feedback helps the bit-lines develop an even larger signal. The cell node storing a high voltage gets restored by the corresponding bit-line, since it stays at VDD level, and the cell node storing a low level does not get pulled too high, since the driver device is held in ON state by the opposite node storing a high. This approach is particularly desirable for high impedance load memory cells, such as the poly resistor load cell or the sub-threshold load cell. This circuit approach actually refreshes the memory cell information, which may have decayed due to excessive leakage or alpha particle incidence. The high impedance load cells are more prone to these types of leakage mechanism.

The advantages to be obtained by improving the sensing operation are interrelated. That is, any advantage in the sensing operation, such as, is provided by the present invention, can be used to provide either a memory having a faster access time or a memory having lower power dissipation, or both. For example, if it is possible to configure the memory bit line loads and sense amplifiers so that the cell drivers are required to pass on smaller current (or a smaller average current) during each read cycle, the cell layout can be revised to used narrower drivers (if they are not already minimum-width, or other process in parameters perinthages with oxide thickness) may be eased.

It is an object of the invention to provide a static random access memory wherein the total charge transferred by the driver transistors of an access memory cell during a read operation is reduced.

It is a further object of the present invention to provide a static random access memory wherein the total charge which is required to be transferred by the write transistors drawing a write operation is reduced.

Thus it an object of the present invention to provide a static random access memory which avoids read-after-read errors.

It is a further object of the present invention to provide a static random access memory (SRAM) having a short write time.

It is a further object of the present invention to provide a SRAM wherein the cell loads are high-impedance, and which has short access time.

It is a further object of the present invention to provide a SRAM having low power dissipation and rapid access.

It is a further object of the present invention to provide a SRAM wherein the bit line loads do not present a low impedance to the write signal during the write operation.

It is a further object of the present invention to provide a SRAM wherein the SRAM cell is required to provide only a small differential signal during the read operation.

It is a further object of the present invention to provide a SRAM wherein each memory cell being read is required to sink a reduced average current during the read out operation.

It is a further object of the present invention to provide a static random access memory wherein any degradation of the signal stored in memory cell is restored immediately when that cell is read.

Many of the problems discussed above can be avoided by using a precharge cycle prior to every read cycle. This technology is discussed, for example, in the 1982 ISSCC paper entitled "A NMOS 64K static RAM," which is hereby incorporated by reference.

However, this technology requires substantially more complex peripheral circuits. In effect, it is not really a static RAM any more, but is what has been referred to as a pseudo-static RAM. That is, many of the overhead requirement of dynamic RAM technology are thus incurred, without correspondently inheriting the advantages of dynamic RAM technology.

Thus it is an object of the present invention to provide a random access memory which does not require precharge on every read cycle.

It is the further object of the present invention to provide a random access memory that does not require any peripheral circuits for the bit line precharging.

According to the present invention there is provided:

An array of memory cells, each memory cell being selectively accessible to provide a differential current signal at a pair of output nodes thereof;

A plurality of bit lines, said bit lines being selectively connected in pairs to said respective pairs of output nodes of a plurality of said cells;

A plurality of bit line loads, one pair of said bit line loads being connected to each pair of said bit lines, the impedance of said bit line loads being dynamically varied in accordance with the differential current signal applied to said respective corresponding pair of bit lines by a respective one of said cells which has been selected.

BRIEF DESCRIPTION OF THE DRAWINGS

The present invention will be described with reference to the accompanying drawings, wherein:

FIG. 1A shows prior art enhancement mode bit line load devices;

FIG. 1B shows prior art depletion mode bit line loads;

FIG. 2 shows a first embodiment of the present invention;

FIG. 3 including FIG. 3a–3i shows a sample mask layout used to configure portions of the circuit shown in FIG. 2;

FIG. 5 shows timing diagrams of read and write operation in the circuit of FIG. 2.

DESCRIPTION OF THE PREFERRED EMBODIMENTS

Figure 4:
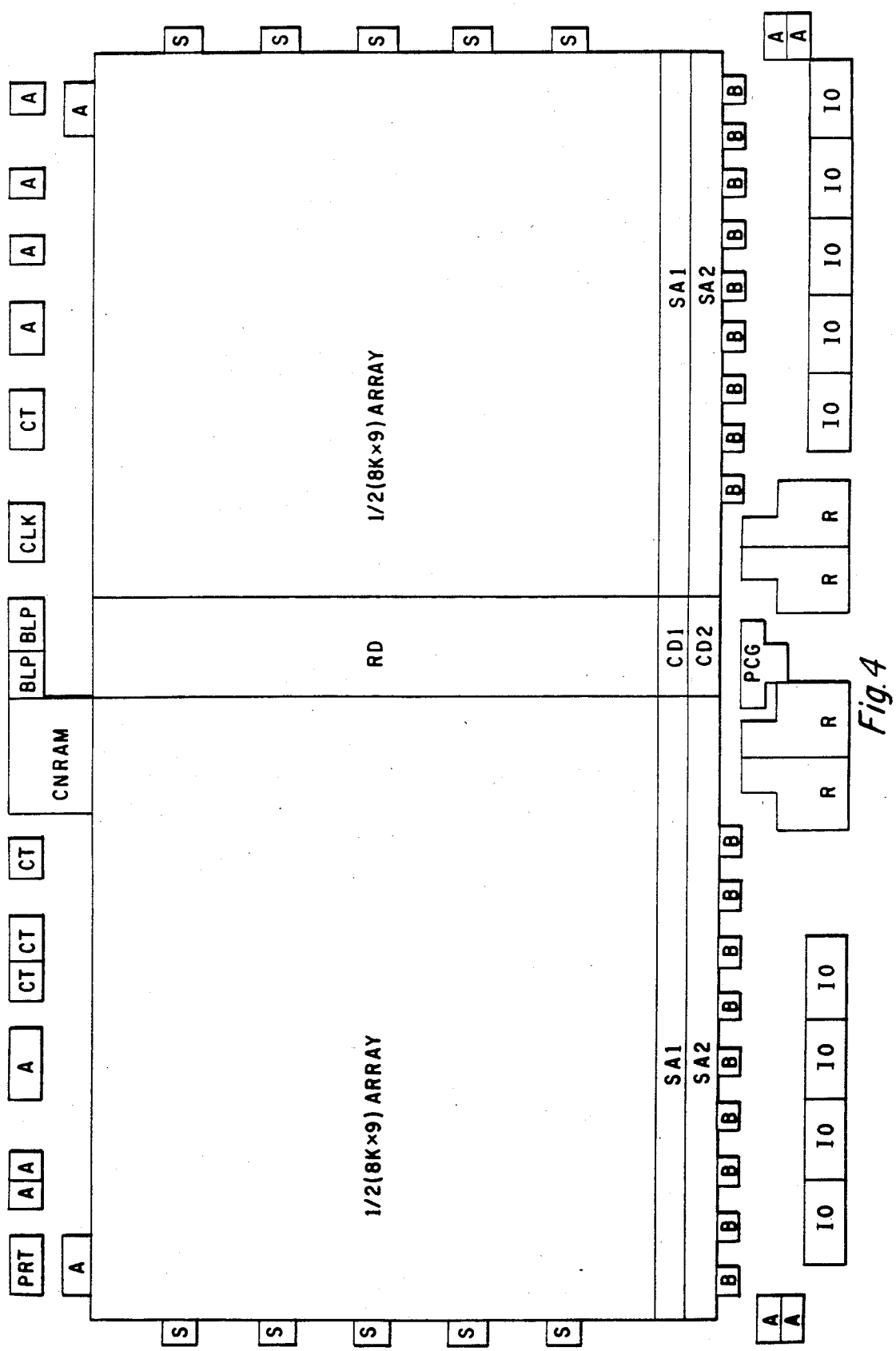
FIG. 4 shows a block diagram of an entire static RAM according to the present invention.

The basic configuration of the proposed sense amplifier of the presently preferred embodiment, with depletion feed-back load devices, is shown in FIG. 2. The memory cell consists of load devices L1 and L2, driver devices ME3 and ME4, and the pass (access) devices ME1 and ME2. The sense amplifier comprises devices MN1–MN4, the current source MD3 and the column select device ME5. The devices ME6 and ME7 are the data write devices. The feed-back load devics are represented by MD1 and MD2. The devices ME1–ME5 are also enhancement type, while MD1–MD3 depletion types, and MN1–MN4 are natural type or the low threshold enhancement type.

As the word line WL goes high, the pass devices ME1 and ME2 are turned on. The memory cell node storing a logic zero (the low voltage) will lower the corresponding bitline BL bar. As this bitline goes low, the corresponding output outbar of the sense amplifier goes low. This signal in turn lowers the gate voltage of the feedback load device MD2 connected to the bitline BL bar going low. This positive feedback helps the cell in further lowering the bitline BL bar. On the other hand, the cell node storing a high level remains high, or gets pulled high to normal logic "1" level if it had decayed down. The sense amplifier has less than unity open loop gain, to protect against runaway (since positive feedback is used). The current source MD3 provides a lower bound for gate voltage on the feedback device, while the upper bound is VDD. The sense amplifier provides a voltage shift to the bitline signal to approximately VDD/2, since the cross coupled devices act as a pair of unity gain potential dividers. The signal is developed by the cell driver devices, and the load device impedance is kept within bounds to avoid runaway conditions.

During the write operation, the signal is forced on to the bitlines by pulling down one of the bitlines to near VSS. This large signal, however, does not burden the load devices too heavily since the same feedback mechanism comes into play and helps data write operation.

That is, the write signal B and its compliment Dbar are applied to the write transistors ME6 and ME7. Assume that D is high, i.e. that "one" is to written into accessed memory cells shown. As signal D rises above the threshold voltage of transistor ME6, ME6 will begin to pull down the bit line BLbar. As the current voltage of BL bar decreases, natural transistors MN2 and MN3 will become less strongly on. That is, the admittance of transistor MN2 will become less than that of transistor MN4, and the current activity of MN3 will become less than that of transistor MN1. When the admittances of these transistors were equal, each series-pair of transistors acted as a voltage divider to set the OUT OUTbar nodes approximately half way between VDD and the drain potential of transistor MD3, but now the voltage of node OUT will begin to rise and the voltage of node OUTbar will begin to fall. Since each of the output nodes already differed from the bit line precharge voltage by an amount close to the threshold voltage of the depletion-mode transistors MD1 and MD2 the transistors MD1 and MD2 are operating in a high gain region. That is, a voltage at node OUTbar drops more rapidly than the voltage on the bit line BLbar. Therefore the negative gate resource drop on load transistor MD2 increases, and the conductance of transistor MD2 decreases. This means that at this point in the right cycle the current through transistor MD2 is less than it would otherwise have been. The current through transistor ME6 includes 3 principal components: the current from transistor MD2; the current from cell load L2, through access transistor ME2; and the current required to change the voltage of the bit line capacitance. Thus the effect of the present invention is that one of these three components is decreased. More of the current through transistor ME6 can therefore be applied to pulling down the bit line capacitance, and the necessary voltage change on bit line BLbar can therefore be induced that much sooner. That is, the total charge passed by the write transistor during one write operation is significantly reduced.

During the power-down mode (i.e. when transistor ME5 is in an off condition) the load transistors MD1 and MD2 will precharge the bit lines close to VDD. That is, the only condition in which one of the load transistors MD1 or MD2 can be off is when a bit line is high and its corresponding output node is lower by more than the threshold voltage of the depletion mode transistors MD1 or MD2. However, if the bit line is more than one depletion-mode threshold voltage above ground, the natural transistor MN1 or MN2 will be turned on, to pull the gate of the load transistor MD1 or MD2 up nearly to VDD. This turns on the load transistor and charges the bit line up to VDD. If one of the bit lines was left at a low voltage, e.g. by a write operation, transistor MD2 will necessarily be on, so that bit line level resperation will necessarily be rapid. Thus both of the complementary pair of bit lines will be pulled high. This means that all four of a natural transistors MN1 to MN4 will have equal gate voltages, and will therefore have approximately equal admittances. The output and output-complements nodes will therefore be restored to voltages approximately half way between supply voltage VDD and the drain voltage of transistor MD3.

In the further embodiment of the present invention, a bit line load whose impedance is dynamically controlled may be connected in a series where a conventional constant impedance or constant-current load. That is, in this embodiment of the invention additional depletion-mode transistor would be interposed inbetween the drain of transistor MD2 and the VDD supply. This additional load transistor would have its gate tied to its source. Thus, the field-assisted current limiting provided by gate-source-tide constant-current depletion loads could be combined with an impedance which is increased by feedback according to the present invention.

It should be noted that the sense amplifier shown on the bottom half of FIG. 2 is preferably not the only sense amplifier used. That is, this amplifier is more precisely referred to as a pre-sense-amplifier, since it is configured to have less than unity gain. It is necessary to provide less than unity open logs gain in the pre-sense-amplifier to avoid runaway, in the positive-feedback configuration taught by the present invention. In the presently preferred embodiment, the pre-sense-amplifier is configured as a source follower circuit, which ensures less than unity gain. Moreover, the bit line load is itself in fact a source power circuit, again assuring less than unity gain. This condition is sufficient to assure stability.

As noted, the present invention preferably uses transistors having three different threshold voltages. In the presently preferred embodiment, with supply voltage VDD=3 volts, the transistors marked MD have threshold voltages of $-1\frac{1}{2}$ voltage, the transistors marked ME have threshold voltages of 0.5 volts, and the transistors marked MN have threshold voltages of 0.2 volts. This means that two mask levels are preferably used to define the threshold voltage implants.

Moreover, it should be noted that the threshold voltage for the depletion devices is a critical parameter. In the presently preferred embodiment, this threshold voltage is set at plus or minus 100 millivolts, which is easily attainable in a production environment. That is, the present invention requires that the impedance of the bit line should be controlled by positive feedback from the bit line voltage changes. To accomplish this with depletion-load field effect transistors as bit line loads, it is necessary that they be biased appropriately. For example, if transistor MD2 had a threshold voltage of minus 6 volts in the embodiment described above, it would be essentially unaffected by the gate to source voltages in the neighborhood of minus $1\frac{1}{2}$ volts which it would receive from output node of OUT bar.

The mask layout used in the presently preferred embodiment to configure the pre-sense-amplifier and positive feedback circuitry according to the present invention is shown in FIG. 3. Preferred device dimensions may be seen in this layout. However, as will be obvious to those skilled in art, this mask layout can be modified and varied in a tremendous variety of ways, and is provided here only in the interests of candid and full disclosure.

The read and write operation of the SRAM of the present invention are shown in FIG. 5, with reference to the nodes marked on FIG. 2.

As noted, in the presently preferred embodiment the pre-sense-amplifier is followed by a further conventional sense amplifier stage. In the presently preferred embodiment, sets of four columns are multiplexed onto one sense amplifier. This means that large high-current transistors can be used in the sense-amplifier, without difficulties caused by the pitch constraint of the columns or other small geometries.

In the presently preferred embodiment, the substrate is biased to about −1 volts with respect to ground (Vss). This can be accomplished by a separate bias pin, or (preferably) by a substrate charge pump.

As discussed above, the present invention provides a read operation which automatically restores the cell being read. Thus, one further application of the present invention is an SRAM with periodic refresh. In such an SRAM, a small amount of additional peripheral circuitry reads every cell in the array at fixed long intervals (e.g. every second). This means that the entire array can use extremely high impedance cell loads (and therefore have a very low power dissipation), with minimal stored signal degredation caused by, e.g. alpha particle errors.

Alternatively, the present invention can be embodied in an "SRAM" which has no cell loads at all (i.e. a 4-transistor DRAM). In this case, some sort of refresh cycle is obviously necessary. However, the present invention permits refresh to be accomplished with minimal hardware, since every cell which is read out is refreshed. Thus, refreshing such a memory can be accomplished merely by successively reading out every cell in the array. Alternatively, modifications could be made to improve the speed of the refresh cycle. Since the output buffer is not required for the refreshing effects of the read cycle, the refresh cycle could be performed without the output buffer enabled. Optionally, for similar reasons, the refresh could be performed with only the primary sense amplifiers enabled and not the secondary sense amplifiers.

The present invention has been described with primary reference to an NMOS SRAM, but the present invention can be embodied in a tremendous variety of other technologies.

For example, the bit line loads must have variable impedance, so that the fedback signal can vary their impedance. However, it is not by any means necessary that they be conventional NMOS depletion-mode transistors. For example, even within such conventional NMOS technology, it would be possible to configure these as enhancement-mode transistors (e.g. having a threshold voltage of 0.5 volts). In this case, the load transistors would precharge the bit lines to less than the supply voltage i.e. to approximately one VT drop below VDD. Alternatively, in an NMOS SRAM wherein CMOS devices are available in the periphery, p-channel devices could be used for the bit line loads. Again, this embodiment is not preferred, but is a possible embodiment of the present invention. In this embodiment, i.e. if transistors MD1 and MD2 in FIG. 2 were p-channel, it would of course be necessary to reverse their connections, i.e. to connect MD2's gate to the OUT node and transistor MD1's gate to the OUT-bar node.) Alternatively, other forms of controllable-impedance bit lines loads could be used. For example, polysilcon field effect transistors could be used, or junction field effect transistors, or other devices.

It is similarly not necessary for the memory cell itself to be an NMOS cell. The present invention is also applicable to static RAMs using CMOS, MESFET, or other technologies.

It is also not necessary to the present invention to be applied to a fully static, that is unclocked, memory. The present invention is equally applicable to, for example, pseudo-static memories, in which a clock cycle is used to precharge the bit line before the read operation. (However, the present invention is not as advantageous in this embodiment, since the higher-impedance conventional depletion loads which can be used in such an embodiment mean that the current passed by pull-down driver in the accessed memory cell does not include as much current from the bit line load device as would otherwise be the case in prior art technologies. However, even in this case, the present invention does reduce the total charge which the pull-down driver in the accessed cell must pass to provided a given signal level on the bit line, and is therefore advantageous. The present invention also serves to reduce the power dissipation during the write mode, which is an important advantage.

It is also not necessary that the bit lines loads be pull-up devices. For example, in a memory technology wherein the bit lines are precharged close to ground, and one of the bit lines is pulled up by a pull-up driver in the accessed cell, the impedance of the bit line loads can still be controlled with possible feedback according to the present invention. Moreover, the present invention can of course be embodied in a PMOS embodiment analog connection of FIG. 2 with power supply voltages reversed, although it of course not be as fast as a NMOS device of comparable dimensions.

The present invention can also be embodied using feedback from a sense amplifier stage subsequent to the first sense amplifier stage to control the impedance of the bit line loads. Again, this embodiment is believed to be less advantageous, but does provide a possible embodiment of the invention. In this embodiment, some form of level shifting will typically be necessary: the subsequent sense amplifier stages are typically optimized to provided a large signal, but this is not desirable on the bit lines, for reasons of read disturb as noted above. If the feedback from the secondary or later sense amplifier stage is to be used to control the bit line loads, a level-shifting stage, such as a source-follower, may have to be interposed. Moreover, since the feedback from a secondary sense amplifier will begin to significantly change the impedance of the load transistors later in read opertion then the feedback from a primary sense amplifier would have this embodiment if not preferred.

The present invention can be conceptionally invisioned as redistributing the gain within the total sense amplification circuit. That is, in the present invention this small signal source is not at the bit line terminals as in the prior art, but at the cell terminals themselves.

Thus the present invention provides an integrated circuit memory wherein, during the read operation, the bit line load which sees an increasing voltage drop presents an increased impedance to that increasing voltage drop. Thus the total current which the cell driver must pass, to change the signal on one of the bit lines a predetermined amount, is reduced. The present invention also provides a semiconductor memory wherein, a write signal is applied to a pair of bit lines, the bit line load which sees an increasing voltage differential is dynamically controlled to increase its impedance, so that the write driver which is attempting to write a level farthest from a bit lines precharged state sees an increasing impedance, so that the amount of charged which this right driver must pass to change the voltage of this bit line by a predetermined amount is minimized.

Thus, the present invention provides the objects discussed above and numerous other advantages. The present invention is the first to use positive feedback in the bit line loads of static random access memory array. The present invention provides a static random access memory array in which extremely small cell geometries can be used, with extremely low static power dissipation, rapid access time, and low error rates.

It should be noted that the prior art frequently uses the term "depletion load" to refer to a depletion-mode transistor *with its gate and source tied together*. Although the presently preferred embodiment does use a depletion-mode load transistor, this is *not* a "depletion load" as that term is generally used.

It will be apparent to those skilled in the art that the present invention provides a fundamental innovation in the area of integrated circuit memories generally, and thus can be widely modified and varied. The key feature in the present invention is simply that positive feedback should be used to dynamically change the load impedance presented to the differential signal read out of (or written into) an accessed memory cell. Thus the claim scope of the present invention is not limited except as specifically set forth in the accompanying claims.

For example, although the presently preferred embodiment of the present invention is directed to an SRAM wherein read and write operations are accomplished with approximately equal speeds, the present invention is also applicable to semiconductor memory technology wherein each memory cell provides a differential output to a complementary pair of bit lines having bit line loads. For example, the present invention is also applicable to multi-dielectric type nonvolatile RAM.

What is claimed is:

1. A memory comprising:
   (a) an array of memory cells, each memory cell being selectively accessible to provide a differential current signal at a pair of output nodes thereof;
   (b) a plurality of bit lines, said bit lines being selectively connected in pairs to said respective pairs of output nodes of a plurality of said cells;
   (c) a plurality of bit line loads, one pair of said bit line loads being connected to each pair of said bit lines; and
   (d) means responsive to said differential current signal applied to said respective corresponding pair of bit lines by a respective one of said cells which has been selected for dynamically varying the impedance of said bit line loads.

2. The memory of claim 1, further comprising a pre-sense-amplifier connected to each said pair of bit lines, said pre-sense-amplifier having less than unity open loop gain and providing an output which is fedback to control the impedance of said bit line loads.

3. The memory of claim 2, wherein said bit line loads comprise depletion-mode transistors, and wherein the output of said pre-sense-amplifier is fed back to gates of said depletion-mode-transistors.

4. The memory of claim 2, further comprising a second sense amplifier, said second sense amplifier comprising input rodes operatively connected to said output of at least one of said pre-sense-amplifiers.

5. The memory of claim 1, further comprising means for reading every one of said memory cells in said memory at predetermined intervals.

6. The memory of claim 1, wherein each said pair of bit line loads is connected between said respective pair of bit lines and a first power supply voltage, and wherein said differential current signal from an accessed one of said memory cells comprises, at one of said output nodes thereof, current flowing between said respective corresponding one of said bit lines and a second supply voltage which is different from said first supply voltage.

7. The memory of claim 6 wherein said bit line loads comprise depletion-mode transistors, and wherein the output of said pre-sense-amplifier is fed back to gates of said depletion-mode transistors.

8. The memory of claim 7, wherein said depletion-mode transistors of a threshold voltage which is more than one third and less than two thirds of the difference between said first and second power supply voltages.

9. The memory of claim 2, wherein said pre-sense-amplifier comprises first and second poll-up transistors each having a gate connected to one of said pair of bit lines, a first source/drain terminal connected to an output mode corresponding to one of said bit line characters which said ? of said device is connected, and a second source/drain terminal connected to said first power supply voltage; and third and fourth pull-down transistors, each comprising a first source/drain terminal, said first source/drain terminal of said third and fourth pull-down transistors been connected together, each comprising a second source/drain terminal connected to one of said pair of output modes, and each comprising a gate connected to the one of said pair of bit lines which does not correspond to said output mode to which said second source/drain terminal ? connected.

10. The memory of claim 9, further comprising a depletion load interposed between said first source/drain terminal of said third and fourth pull-down transistors and said second supply voltage.

11. The memory of claim 10, further comprising a power-up transistor interposed between said depletion mode and said second supply voltage.

12. The memory of claim 9, further comprising first and second write transistors, each connected between a respective one of said pair of bit lines and said second supply voltage.

13. The ecstatic random access memory comprising:
   a plurality of static memory cells, each cell comprising first and second access transistors, first and second driver transistors, and at least one cell load element;
   a plurality of pairs of bit lines, each said pair of bit lines being connected to said respective access transistors of each of a plurality of said memory cells;
   a plurality of pre-sense-amplifiers, each said pre-sense-amplifier having a pair of input nodes attached to one of said pairs of bit lines and controlling a pair of output nodes in correspondence with said pair of input nodes thereof; and
   a plurality of pairs of bit line loads, each said pair of bit line loads being connected to one of said pairs of bit lines, each of said bit line loads being interposed between said corresponding one of said bit lines and a first power supply voltage, each of said bit line loads comprising a transistor having a gate connected to one of said output modes of said pre-sense-amplifier.

14. The memory of the previous claim wherein said bit line loads comprised of depletion-mode transistors.

* * * * *

UNITED STATES PATENT AND TRADEMARK OFFICE
CERTIFICATE OF CORRECTION

PATENT NO. : 4,586,166
DATED : April 29, 1986
INVENTOR(S) : Ashwin H. Shah

It is certified that error appears in the above-identified patent and that said Letters Patent is hereby corrected as shown below:

In the Abstract:

On lines 3 and 4, delete "depletion-made" and insert --depletion-mode--.

In the Specification:

In column 1, line 30, delete "phoms" and insert --forcing--;
line 34, delete "Write" and insert --write--;
line 41, delete "volltage" and insert --voltage--;
line 43, delete "a";
line 55, delete "biaseffects" and insert --bias effects--;
line 61, delete "Write" and insert --write--;

In column 2, line 27, between "approximately" and "(1/2)" insert --minus--;
lines 64 and 65 between "minimum-width" and "," insert --)--;
line 65, delete "process in" and insert --processing--;
line 65, delete "perinthages with oxide thickness)";

In column 4, line 38, delete "outbar" and insert --OUTbar--;
line 61, delete "B" and insert --D--;
line 66, delete "current";

In column 5, line 2, delete "current activity" and insert --admittance--;
line 6, between "OUT" and "OUTbar" insert --and--;
line 16, delete "resource" and insert --to source--;
line 19, delete "right" and insert --write--;

UNITED STATES PATENT AND TRADEMARK OFFICE
CERTIFICATE OF CORRECTION

PATENT NO. : 4,586,166

DATED : April 29, 1986

INVENTOR(S) : Ashwin H. Shah

It is certified that error appears in the above-identified patent and that said Letters Patent is hereby corrected as shown below:

In column 6, line 6, delete "logs" and insert --loop--;
          line 13, delete "power" and insert --follower--;
          line 32, delete "depletion-load" and insert --depletion-mode--;

and

In column 8, line 31, delete "opertion" and insert --operation--.

In the Claims:

In claim 4, line 3, delete "rodes" and insert --nodes--;

In claim 8, line 3, between "the" and "difference" insert --negative of the--;

In claim 9, line 2, delete "poll-up" and insert --pull-up--;
          line 5, delete "mode" and insert --node--;
          line 5, delete "line" and insert --lines--;
          line 5, delete "characters" and insert --lines--;
          line 6, delete "?" and insert --first source/drain--;

UNITED STATES PATENT AND TRADEMARK OFFICE
CERTIFICATE OF CORRECTION

PATENT NO. : 4,586,166

DATED : April 29, 1986

INVENTOR(S) : Ashwin H. Shah

It is certified that error appears in the above-identified patent and that said Letters Patent is hereby corrected as shown below:

In claim 9, line 13, delete "modes" and insert --nodes--;
line 16, delete "mode" and insert --node--;
line 16, delete "?" and insert --is--;

In claim 13, line 1, delete "ecstatic" and insert --static--; and on
line 21, delete "modes" and insert --nodes--.

Signed and Sealed this

Eighth Day of August, 1989

Attest:

DONALD J. QUIGG

Attesting Officer

Commissioner of Patents and Trademarks